(12) United States Patent
Cerio, Jr. et al.

(10) Patent No.: US 7,901,545 B2
(45) Date of Patent: *Mar. 8, 2011

(54) IONIZED PHYSICAL VAPOR DEPOSITION (IPVD) PROCESS

(75) Inventors: Frank M. Cerio, Jr., Phoenix, AZ (US); Jacques Faguet, Gilbert, AZ (US); Bruce D. Gittleman, Scottsdale, AZ (US); Rodney L. Robison, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 1121 days.

This patent is subject to a terminal disclaimer.

(21) Appl. No.: 10/811,326

(22) Filed: Mar. 26, 2004

(65) Prior Publication Data

US 2005/0211545 A1 Sep. 29, 2005

(51) Int. Cl.
*C23C 14/34* (2006.01)

(52) U.S. Cl. ............ 204/192.3; 204/192.12; 204/192.17; 204/192.32; 438/580; 438/653; 438/656; 438/685; 438/686; 438/687

(58) Field of Classification Search ............. 204/192.12, 204/192.3, 192.32; 438/580, 653, 656, 685, 438/686, 687
See application file for complete search history.

(56) References Cited

U.S. PATENT DOCUMENTS

| | | | | |
|---|---|---|---|---|
| 6,051,114 A | * | 4/2000 | Yao et al. | 204/192.3 |
| 6,255,187 B1 | * | 7/2001 | Horii | 438/396 |
| 6,274,008 B1 | * | 8/2001 | Gopalraja et al. | 204/192.17 |
| 6,287,435 B1 | | 9/2001 | Drewery et al. | |
| 6,444,099 B1 | | 9/2002 | Sasaki et al. | |
| 6,642,146 B1 | | 11/2003 | Rozbicki et al. | |
| 7,642,201 B2 | * | 1/2010 | Cerio et al. | 438/785 |
| 2003/0034244 A1 | * | 2/2003 | Yasar et al. | 204/192.3 |

FOREIGN PATENT DOCUMENTS

JP 09-036040 * 2/1997

OTHER PUBLICATIONS

Machine Translation of 09-036040 dated Feb. 1997.*

* cited by examiner

*Primary Examiner* — Rodney G McDonald
(74) *Attorney, Agent, or Firm* — Wood, Herron & Evans, LLP

(57) ABSTRACT

An iPVD system is programmed to deposit uniform material, such as barrier material, into high aspect ratio nano-size features on semiconductor substrates using a process which enhances the sidewall coverage compared to the field and bottom coverage(s) while minimizing or eliminating overhang within a vacuum chamber. The iPVD system is operated at low target power and high pressure >50 mT to sputter material from the target. RF energy is coupled into the chamber to form a high density plasma. A small RF bias (less than a few volts) can be applied to aid in enhancing the coverage, especially at the bottom.

12 Claims, 9 Drawing Sheets

PROCESS TIME

RF BIAS POWER

OVERHANG COMPARISON

STD D/E

LND

IONIZED PHYSICAL VAPOR DEPOSITION (IPVD) PROCESS

This application is related to commonly assigned and copending U.S. Patent Application Publication No. 20030034244, hereby expressly incorporated herein by reference.

FIELD OF THE INVENTION

The invention relates to the metallization of via and trench structures on semiconductor wafers. More particularly, the invention relates to the metallization of high aspect ratio via and trench structures of silicon wafers utilizing ionized sputtered materials to form barrier and seed layers of the substrates.

BACKGROUND OF THE INVENTION

In the metallization of high aspect ratio vias and trenches on semiconductor wafers, it is required that the barrier and seed layer have good sidewall coverage.

Ionized PVD deposition is used for barrier and seed layer metallization in advanced IC wafers. Ionized PVD provides good sidewall and bottom coverage in via and trench structures. However, as the geometries shrink and as the via dimensions go down below 0.15 micrometers, ionized deposition requirements become more critical. Therefore, it is highly desirable to have an ionized PVD process where bottom and sidewall coverage are well balanced and overhang is minimized.

Accordingly, there is a need to further control step coverage of the metal or the overhang that typically develops during the deposition step.

SUMMARY OF THE INVENTION

The invention provides a method of operating an ionized physical vapor deposition (iPVD) system in which a patterned substrate is positioned on a wafer table within a processing chamber in the iPVD system; a barrier layer is deposited using a Low Net Deposition (LND) process, wherein a bias on the wafer table is adjusted to establish an ultra-low deposition rate in a field area of the patterned substrate; and a seed layer is deposited on the patterned substrate using a No Net Deposition (NND) process, wherein the bias on the wafer table is adjusted to cause the deposition rate to be approximately zero in the field area of the patterned substrate.

BRIEF DESCRIPTION OF THE DRAWINGS

A more complete appreciation of various embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Figure 1:
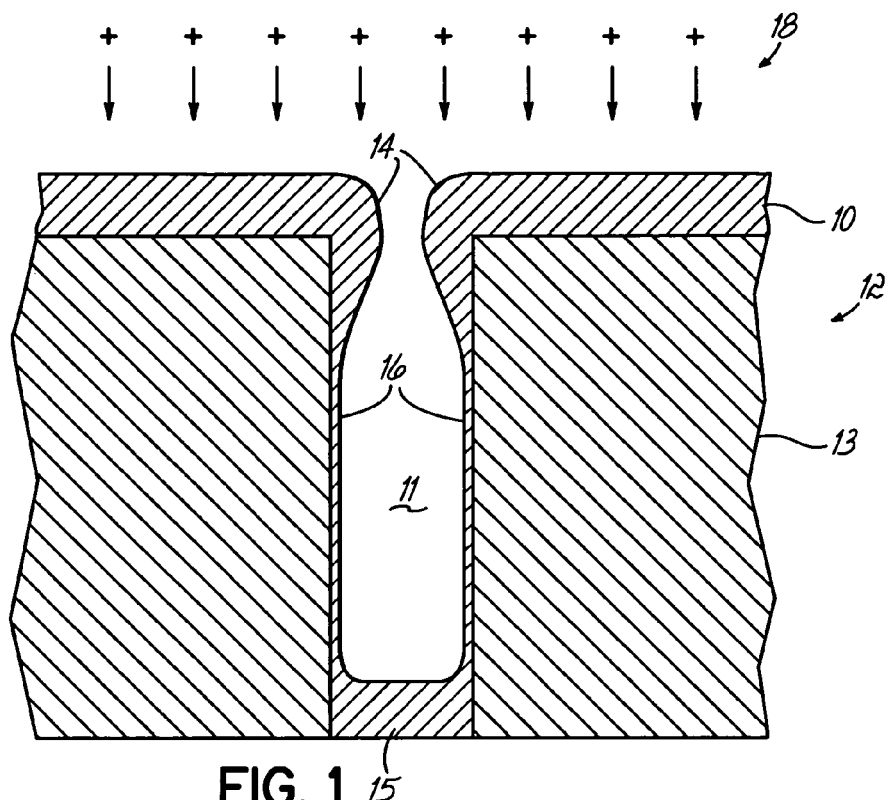
FIG. 1 illustrates a simplified view of a wafer cross-section in accordance with an embodiment of the invention.

A process is described in U.S. Patent Application Publication No. 20030034244 by Yasar et al., which is copending and assigned to the assignee of the present application, that provides ionized PVD with sequential deposition and etching. While with this type of sequencing the overhang or overburden are much improved over prior processes, some will still form during the deposition sequence and may not be entirely removed in the etch sequence.

Yasar et al. describe a technique to deposit and etch multiple times within a single vacuum chamber. Overhangs are not fundamentally controlled within the deposition step of this process. Higher bias powers are typically used in the deposition step to deposit as much bottom coverage as possible before etching back the bottom to redistribute material to the sidewalls and reduce the bottom coverage, which can add to line resistance. Reduction of overhang is achieved in the subsequent etch steps.

The invention provides a method of operating an ionized physical vapor deposition (iPVD) system to deposit material into nano features on a patterned substrate on a wafer table within a processing chamber in the iPVD system. The method may be used, for example, to deposit a barrier layer using a Low Net Deposition (LND) iPVD process, wherein a bias on the wafer table is adjusted to establish an ultra-low deposition rate in a field area of the patterned substrate. The method may also be used, for example, to deposit a seed layer on the sidewalls of nano features on the patterned substrate using a No Net Deposition (NND) iPVD process, wherein the bias on the wafer table is adjusted to cause the net deposition rate to be approximately zero in the field area of the patterned substrate.

The field area refers to the upper surface of the substrate being processed and is the surface into which the high aspect ratio vias and trenches extend. An ultra-low deposition rate as referred to herein is a deposition rate of less than about 30 nanometers per minute.

An iPVD process is used for the LND and NND processes. An iPVD process is typically performed in the vacuum processing chamber of an iPVD apparatus in which the substrate to be coated is held on a support. A high density plasma is maintained in the chamber in a processing gas, which can be, for example, an inert gas into which metal or other coating material vapor has been introduced, usually by sputtering. The high density plasma is usually ionized by coupling RF energy into the process gas, often by an inductive coupling from outside of the chamber. The RF energy ionizes both the process gas and a fraction of the coating material, which may be to a low plasma potential of only a few volts, but may be higher. The processing gas and the ionized coating material can then be directed onto the substrate by control of the bias on the substrate, to either coat or etch the substrate, or both. For the LND and NND processes of the present invention, an iPVD process is run, but with the deposition rates reduced as explained in the examples below. The parameters of the iPVD process are controlled to produce the LND or NND result on the plasma facing surface of the substrate, or field area of the substrate. When so controlled, the iPVD process in a manner set forth in the various examples, produces the desired result of deposition of a barrier layer or a seed layer, without producing overhangs around the feature openings.

In material processing systems, wafers or other substrates are positioned on holders, such as chucks, that can include heating and/or cooling elements. In one embodiment of the invention, an improved holder is provided that includes a unique heater element that comprises a high purity carbon wire encased in quartz.

Exemplary embodiments of the method of the invention are described below, which disclose a deposition technique for use with an iPVD system to metallize high aspect ratio vias and trenches by depositing ionized metal with a flux to the field area surface of the substrate that may produce a flux to the sidewall of the feature. This technique does not rely on an etch sequence to control the conformality of the metal. The deposition process is such that the overhang or overburden is eliminated or minimized, reducing the reliance on or need for the etch step as an overhang control. In the described embodiments, the process involves first depositing a thin layer of a barrier metal such as Ta or TaN and then followed by a seed layer metal such as Cu.

In this process according to one embodiment of the invention, material is deposited into high aspect ratio structures with vias and trenches less than 130 nm in size using an ionized film deposition (iPVD) process.

This invention is distinctly different from prior art which teaches high DC powers with high RF bias powers for increased conformality or the case where several deposition and etch steps are performed within or in different vacuum chambers. This process is characterized by very low deposition rates. For example, the DC power can be reduced to reduce the deposition rate to less than 10 nm/min. Additionally or in the alternative, little or no bias is applied to the wafer during the deposition.

FIG. 1 illustrates a simplified view of a wafer cross-section in accordance with an embodiment of the invention. In the illustrated embodiment, a via structure 11 is shown having a metal film 10 deposited on the sidewalls 16 of the via structure and metal film 10 deposited on the bottom 15 of the via structure. A modified iPVD process is used to deposit the metal film 10 into via structure 11 formed in a dielectric interlayer 13 of a semiconductor wafer 12. As metal ions 18 are deposited onto the wafer 12, the metal deposition has a propensity to become thicker at the via entrance causing an overhang structure 14. The method of the invention can prevent or reduce the overhang structure. Similarly, the deposition of metal at the bottom 15 of the via 11 can become thicker than at the sidewalls 16. The method of the invention provides a more uniform deposition of material on the sidewalls and the bottom of the via.

Figure 2:
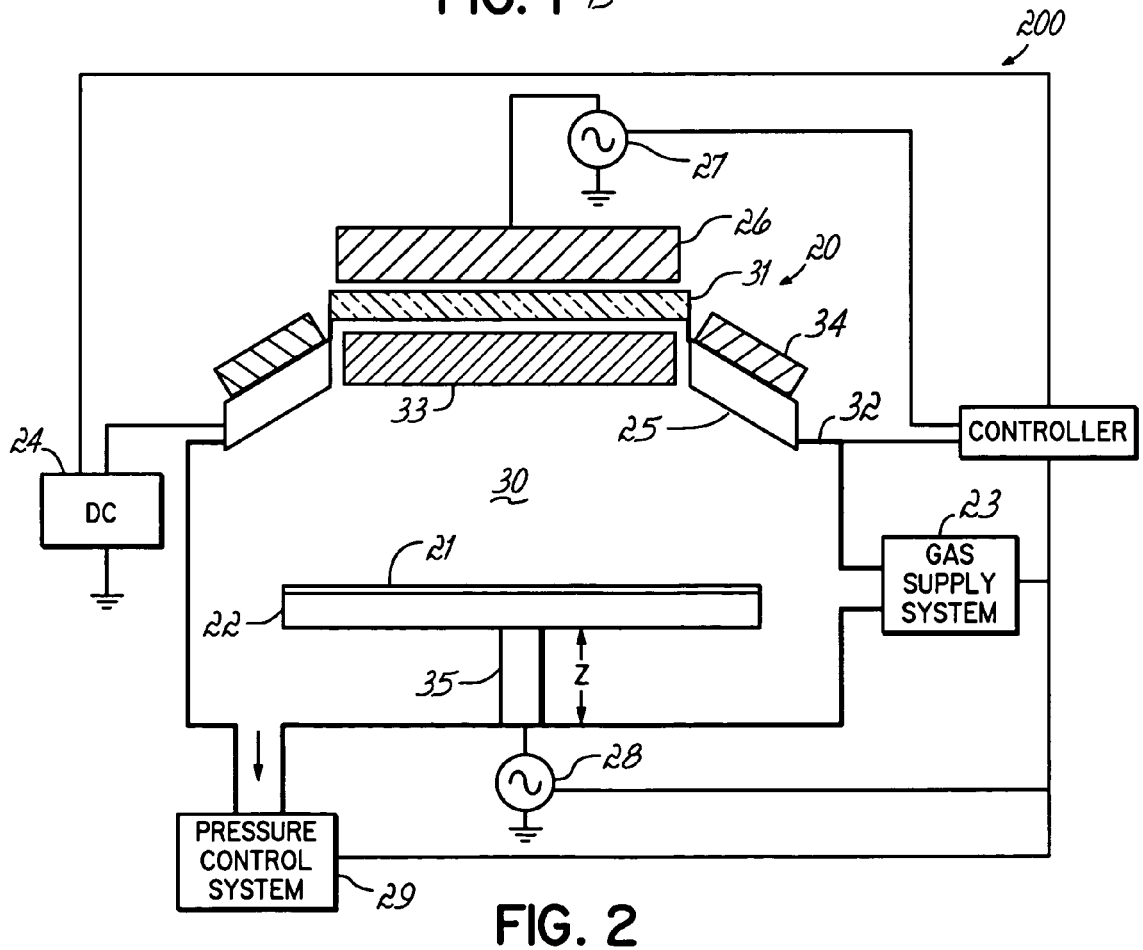
FIG. 2 illustrates an exemplary block diagram of a processing system according to an embodiment of the invention.

FIG. 2 illustrates an exemplary block diagram of a processing system according to an embodiment of the invention. In the illustrated embodiment, an iPVD system 200 is shown.

The iPVD system comprises an iPVD processing module, a gas supply system 23 coupled to a processing chamber 32, a pressure control system 29 coupled to the processing chamber 32, a first RF source 27 coupled to the processing chamber 32, an RF bias generator 28 coupled to the processing chamber, and a DC source 24 coupled to the processing chamber.

The iPVD system comprises a controller 50 coupled to the processing chamber; coupled to the gas supply system 23; coupled to the pressure control system 29; coupled to the first RF source 27; coupled to the second RF source 28; and coupled to the DC source 24.

The iPVD processing module further comprises an antenna 26, a window 31 coupled to the antenna, a louvered deposition baffle 33 coupled to the window, a target 25, and a permanent magnet pack 34 coupled to the target. RF power can be supplied to the antenna 26 from the RF generator 27, and can be used to create an inductively coupled plasma in the chamber 32. The permanent magnet pack 34 can be located behind the target 25 and can be used to produce a magnetic tunnel over the target 25 for magnetron sputtering.

The antenna 26 can be positioned outside of the chamber 30 behind a dielectric window 31 in the chamber wall 32. A louvered deposition baffle 33, preferably formed of a slotted metallic material, is located inside of the chamber 30 closely spaced from the window 31 to shield the window 31 from deposition. The controller 50 can be used to determine the amount of ICP power to provide and when to have it applied to the antenna. For example, ICP power from the RF generator 27 to the antenna 26 can be switched between different power levels during the deposition process.

The operating frequency for the RF generator 27 can range from 1 MHz to 100 MHz. For example, an operating frequency of approximately 13.56 MHz can be used. Alternately, other frequencies can be used.

The iPVD processing module also comprises a wafer table 22 that is coupled to the processing chamber using a Z-motion drive 35. The Z-motion drive 35 can be used to adjust the substrate-to-source distance to provide the best deposition uniformity, and the best coverage and symmetry of the sidewall 16 and bottom 15 of the via 11. The controller 50 can be used to determine the Target to Substrate (TS) separation distances required during the deposition process and provide the control data to the Z-motion drive 35 when it is required. During the improved deposition process, the substrate-to-source distance can typically be 150 to 275 mm.

The wafer table 22 can accommodate a 200 mm wafer, or 300 mm wafer. For example, wafer 21 can be transferred into and out of processing chamber 30 through an opening (not shown) that is controlled by a gate valve assembly (not shown). In addition, wafer 21 can be transferred on and off the wafer table using a robotic substrate transfer system (not shown). In addition, wafer 21 can be received by substrate lift pins (not shown) housed within wafer table 22 and mechanically translated by devices housed therein. Once the wafer 21 is received from the transfer system, it can be lowered to an upper surface of the wafer table 22.

During processing, a wafer 21 can be held in place on top of the wafer table 22. For example, an electrostatic chuck can be used as the wafer table 22. In addition, the wafer temperature can be controlled when the wafer is on the wafer table 22. For example, heating and/or cooling elements (not shown) can be used. The temperature of the wafer 21 can be controlled to obtain the best via metallization. The controller 50 can be used to determine and control the wafer temperature. In addition, wafer temperature can be controlled by providing the wafer table 22 with cooling fluid passages and the appropriate temperature controls. Good thermal contact between the wafer table 22 and the wafer 21 can be achieved by providing backside gas conduction between the wafer 21 and the wafer table 22. Backside gas pressure can be controlled during the deposition steps to insure that thin metal deposition, especially at the sidewalls of the via structures, are not agglomerated.

Heat generated at the substrate 21 during processing can be extracted efficiently by the wafer table 22 to keep the temperature of the wafer 21 at substantially below room temperature, preferably below 0°, preferably to about −30° Celsius.

RF bias power can be supplied to the wafer table 22 using the RF bias generator 28, and can be used to provide a wafer bias. The controller 50 can be used to determine the amount of RF bias power to provide and when to have it applied to the wafer table. For example, RF bias power can be turned on to a level appropriate during deposition to provide a net negative bias on the wafer 21 to improve and affect the process.

The operating frequency for the RF bias generator 28 can range from 1 MHz to 100 MHz. For example, an operating frequency of approximately 13.56 MHz can be used. Alternately, other frequencies can be used.

Process gas can be provided to the processing chamber 30 by the gas supply system 23. The process gas can comprise a metal-containing gas or an inert gas, or a combination thereof. The inert gas may be argon, which is often used, but may also be any other inert gas or may be a non-inert gas that is compatible with the process.

Chamber pressure can be controlled using the pressure control system 29. For example, process gas can be supplied into the vacuum processing chamber 30 by the gas supply system 23. The chamber pressure can be maintained at a vacuum by the pressure control system 29. The controller can be used to control the flow rate and chemistry for the process gas, and to control the chamber pressure accordingly.

DC power can be supplied from a power source 24 to the target 25. The controller 50 can be used to determine the amount of DC power to provide and when to have it applied to the target. After a certain desired amount of deposition, the DC power 24 to the target 25 is reduced or turned off to substantially reduce or stop the deposition process. In some cases, the deposition process can be substantially reduced and/or stopped by reducing the DC power level 24 to a very low level without completely turning it off.

The iPVD system comprises a serviceable module capable of providing features and operating conditions including the following: (1) base vacuum of less than 10-8 Torr, (2) operating inert gas pressure of between 30 and 130 mTorr, (3) provision for reactive gas at partial pressure of 0-50 mTorr, (4) variable substrate to target spacing of 6 to 9 inches, (5) electrostatic chucking with backside gas heating or cooling, and (6) shielding that restricts deposition to removable, cleanable components with surfaces having good adhesion of sputtered material to prevent particle generation.

The general concepts of the iPVD system are described in U.S. Pat. No. 6,287,435 that is incorporated herein by reference. The iPVD system is well suited for maintaining a high level of metal ions in the process gas ion plasma with independent control of the metal ion flux to the wafer. This level of flexibility allows for a reduction of the metal flux to the substrate while still having highly ionized metal flux. The consequence of this setup is that the process can be controlled at the wafer level to give highly conformal film coverage with little or no overhang over nano-scale features with high aspect ratios.

The controller 50 can be configured to provide control data to the system components and receive process and/or status data from the system components. For example, the controller 50 can comprise a microprocessor, a memory (e.g., volatile or non-volatile memory), and a digital I/O port capable of generating control voltages sufficient to communicate and activate inputs to the iPVD system 200 as well as monitor outputs from the iPVD system 200. Moreover, the controller 50 can exchange information with the system components, and a program stored in the memory can be utilized to control the aforementioned components of an iPVD system 200 according to a process recipe. In addition, the controller 50 can be configured to analyze the process and/or status data, to compare the process and/or status data with target process and/or status data, and to use the comparison to change a process and/or control a system component. In addition, the controller can be configured to analyze the process and/or status data, to compare the process and/or status data with historical process and/or status data, and to use the comparison to predict, prevent, and/or declare a fault.

A main sputtering plasma that is trapped under the field of the magnetron magnets at the surface of the target sputters coating material from the target and into the region of the processing space occupied by the dense secondary plasma, where a substantial portion of the material is stripped of electrons to form positive ions of the coating material. A negative bias voltage is applied to a wafer on the substrate holder, which attracts the positive ions of sputtering material from the region of the secondary plasma and toward and onto the surface of the substrate, with the angles of incidence approaching being perpendicular to the substrate so that they can enter trenches and holes on the wafer substrate to coat the bottoms of these holes and trenches.

In one embodiment, a conical target is used, but this is not required for the invention. Alternately, other target configurations can be used. The iPVD system provides the following features and properties: (1) requires minimum operator effort and smallest possible set of tools to perform routine tasks, (2) provides separation of RF and DC power from water to the best extent possible, (3) provides relative simplicity of design and operation; (4) allows rapid repair or replacement of the source including quick replacement of the whole internal source assembly, (5) provides modular internal assemblies, and (6) maintains RF shielding integrity to prevent leakage of radiation into the operating environment.

Figure 3:
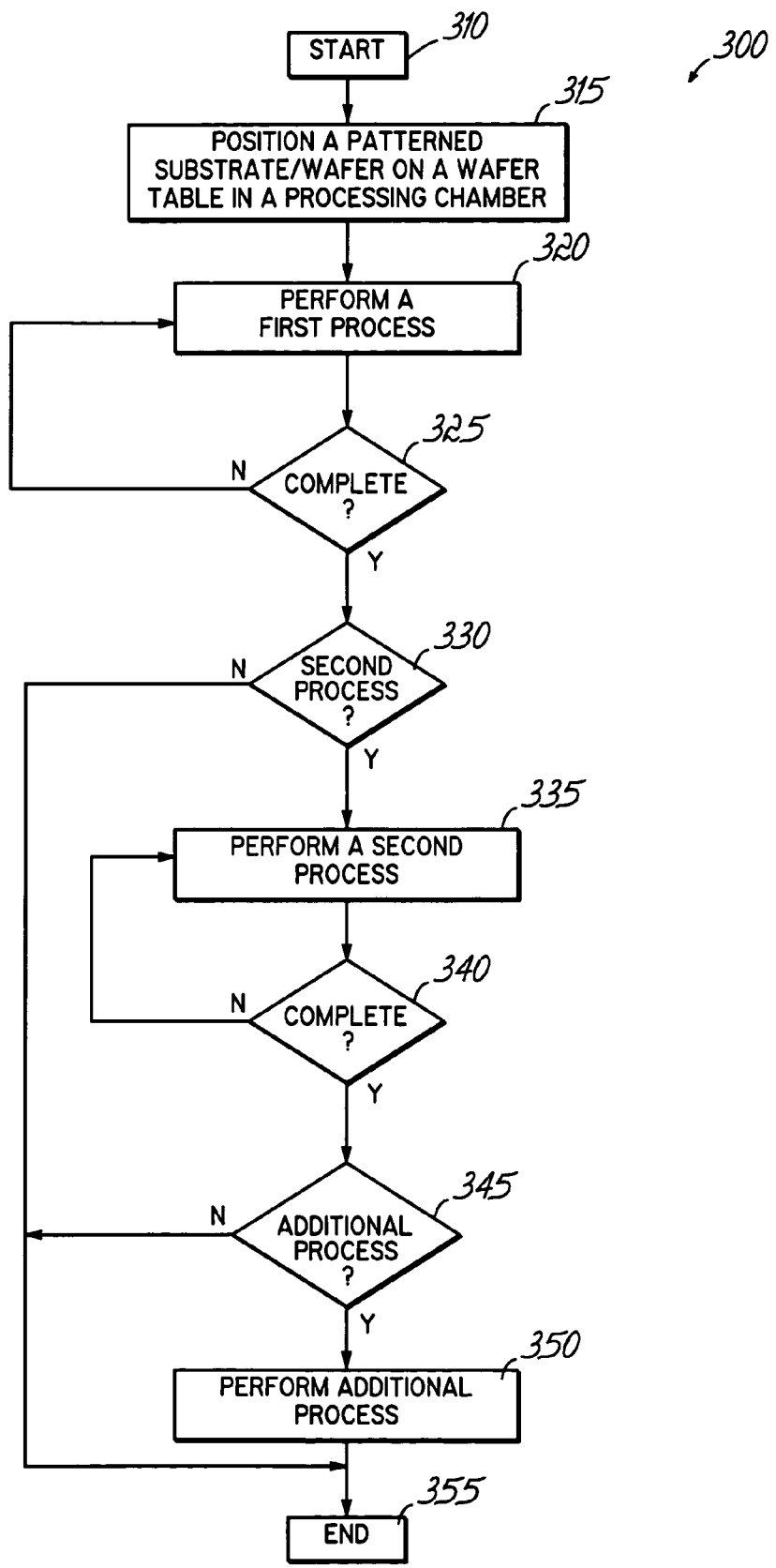
FIG. 3 illustrates a simplified flow diagram of a method of operating an iPVD system in accordance with an embodiment of the invention.

FIG. 3 illustrates a simplified flow diagram of a method of operating a deposition system in accordance with an embodiment of the invention. In the illustrated embodiment, a Low Net Deposition (LND) process is performed followed by a No Net Deposition (NND) process. In alternate embodiments, other procedures can be performed including single LND processes, single NND processes, and various combinations of LND processes and NND processes. Procedure 300 starts in 310.

In 315, a patterned substrate/wafer can be positioned on a wafer table in a processing chamber as described herein. Alternatively, a non-patterned substrate/wafer can be used. For example, the processing chamber can be a deposition chamber.

In 320, a first process can be performed. In one embodiment, the first process can comprise performing an LND process, and the LND process can be performed in a processing chamber. In an alternate embodiment, an NND process can be performed. A high density plasma can be created in the processing chamber, and the high density plasma can comprise a large concentration of metal ions and a large number of process gas ions. The patterned substrate can be exposed to the high density plasma. In one embodiment, the wafer table can be vertically translated.

At least one of a chamber pressure, chamber temperature, substrate temperature, a process gas chemistry, a process gas flow rate, a target material, an ICP power, substrate position, a target power, and a substrate bias power can be adjusted to establish an LND deposition rate which comprises an ultra-low deposition rate in the field area of the patterned substrate. As the LND process is performed material can be deposited into features of the patterned substrate while producing substantially no overhanging material at openings of the features.

An LND process can comprise an LND pre-process time, an LND processing time, or an LND post-process time, or a combination thereof. In an alternate embodiment, different times may be used. The LND pre-process time can vary from approximately 0 seconds to approximately 50 seconds; LND processing time can vary from approximately 10 seconds to approximately 500 seconds; and the LND post-process time can vary from approximately 0 seconds to approximately 50 seconds.

In one embodiment, the LND process can be performed using an ionized physical vapor deposition (iPVD) processing chamber. In an alternate embodiment, the LND process can be performed using other types of deposition chambers, such as PVD chambers, CVD chambers, and PECVD chambers.

In one embodiment, the deposition system can comprise a substrate bias generator that can provide substrate bias power to the wafer table. In an alternate embodiment, a substrate bias generator is not required. The substrate bias power can be adjusted to establish an LND deposition rate during the LND process. The substrate bias power can be adjusted to a first value in a range below a sputtering threshold during the LND process. In an alternate embodiment, the substrate bias power can be adjusted to more than one value in a range below a sputtering threshold during the LND process. For example, a controller can be used, and the substrate bias power can be changed to optimize the process to ensure that substantially no overhang is produced.

The substrate bias generator can be an RF generator, and the RF generator can operate in a frequency range from approximately 1 MHz to approximately 100 MHz. For example, the RF generator can be operated at approximately 13.56 MHz. The substrate bias power can range from approximately 0.0 w to approximately 1000 w. For example, the substrate bias power can range from approximately 130 w to approximately 200 w.

In addition, the deposition system can comprise a target and a target power source that can provide LND target power to the target. In an alternate embodiment, a target power source is not required. For example, target material may be provided in vapor form. The LND target power can be adjusted to establish an LND deposition rate during the LND process. The LND target power can be adjusted to a value in the LND zone (FIG. 7) during the LND process. In an alternate embodiment, the LND target power can be adjusted to more than one value in the LND zone during the LND process. For example, a controller can be used, and the LND target power can be changed to optimize the process to ensure that substantially no overhang is produced.

The LND target power can be adjusted to achieve an ultra-low deposition rate in the field region of the patterned substrate, the ultra-low deposition rate being less than 30 nm/min.

The target power source can be a DC power source. In an alternate embodiment, the target power source can be an RF generator that can be operated in a frequency range from approximately 1 MHz to approximately 100 MHz. The LND target power can range from approximately 10 w to approximately 2000 w. For example, the LND target power can range from approximately 800 w to approximately 1600 w.

The deposition system can further comprise a permanent magnet pack coupled to the target.

The deposition system can comprise a pressure control system coupled to the processing chamber, and the pressure control system can be used to establish an LND chamber pressure during at least a portion of the LND processing time. The LND chamber pressure can range from approximately 1 mTorr to approximately 100 mTorr. For example, the LND chamber pressure can range from approximately 20 mTorr to approximately 70 mTorr.

In one embodiment, the deposition system can comprise an antenna, a dielectric window coupled to the antenna and a wall of the processing chamber, a louvered deposition baffle coupled to the dielectric window, and a ICP source coupled to the antenna to provide ICP power to the antenna. Alternately, different configurations can be used. The ICP power can be adjusted to establish a high density plasma in the processing chamber during the LND process. For example, a controller can be used, and the ICP power can be changed to optimize the process to ensure that substantially no overhang is produced.

The ICP source can be an RF generator, and the ICP source can operate in a frequency range from approximately 1.0 MHz to approximately 100 MHz. For example, the ICP source can be operated at approximately 13.56 MHz. The ICP power can range from approximately 2000 w to approximately 10000 w. For example, the ICP power can range from approximately 3000 w to approximately 6000 w.

The deposition system can also comprise a gas supply system coupled to the processing chamber, the gas supply system can be used to flow process gas into the processing chamber during at least a portion of the LND processing time. The process gas can comprise an inert gas, a nitrogen-containing gas, an oxygen-containing gas, or a metal-containing gas, or a combination thereof.

The nitrogen-containing gas can comprise $N_2$, NO, $N_2O$, or $NH_3$ or a combination thereof, and the oxygen-containing gas can comprise $O_2$, NO, $N_2O$, or $H_2O$ or a combination thereof.

The inert gas can comprise argon, helium, krypton, radon, or xenon, or a combination thereof. The metal-containing gas comprises copper (Cu), tantalum (Ta), titanium, (Ti), ruthenium (Ru), iridium (Ir), aluminum (Al), silver (Ag), or lead (Pt), or a combination thereof.

In one embodiment, the LND process can be used to deposit a barrier layer. For example, the barrier can comprise a metal.

In some cases the wafer can be removed from the processing chamber and measured in another chamber. For example, an optical digital profile (ODP) tool can be used. In addition, Scanning Electron Microscope (SEM) data and/or TEM data can be used.

In 325, a query is performed to determine when to stop performing the first process. When a decision is made to stop the first process, procedure 300 continues to 330, and when a decision is made not to stop the second process, procedure 300 branches back to 320, and procedure 300 continues as shown in FIG. 3. For example, one or more of the LND deposition processes may be performed one or more times.

In 330, a query is performed to determine when to perform a second process. When a decision is made to perform a second process, procedure 300 continues in 335. When a decision is made not to perform a second process, procedure 300 branches to 355 and ends.

In 335, a second process can be performed. The process results from the first process can be used to determine the type of process to perform as the second process.

In one embodiment, the second process can include performing an NND process, and the NND process can be performed in the same processing chamber. Alternately, the NND process can be performed in a different processing chamber. In other embodiments, the second process can comprise one or more LND processes.

An NND process can comprise an NND pre-process time, an NND processing time, or an NND post-process time, or a combination thereof. In an alternate embodiment, different times may be used. The NND pre-process time can vary from approximately 0 seconds to approximately 50 seconds; NND processing time can vary from approximately 10 seconds to approximately 500 seconds. For example, from approximately 20 seconds to approximately 100 seconds; and the NND post-process time can vary from approximately 0 seconds to approximately 50 seconds.

The processing chamber conditions can be changed, and an NND process can be performed. A chamber pressure, chamber temperature, substrate temperature, a process gas chemistry, a process gas flow rate, a target material, an ICP power, substrate position, a target power, or a substrate bias power, or a combination thereof, can be adjusted to change the deposition rate from the LND deposition rate to an NND deposition rate.

The NND deposition rate can comprise a field deposition rate that is the rate of deposition of material in the field region of the patterned substrate. The field deposition rate can range from approximately −10 nm/min to approximately +10 nm/min. For example, the field deposition rate can range from approximately −3 nm/min to approximately +3 nm/min. The NND deposition rate can comprise a sidewall deposition rate that is the rate of deposition of material on one or more sidewalls of one or more features of the patterned substrate. The sidewall deposition rate can range from approximately 0 nm/min to approximately +10 nm/min. For example, the field deposition rate can range from approximately 0 nm/min to approximately +5 nm/min. The NND deposition rate can comprise a bottom surface deposition rate that is the rate of deposition of material on one or more bottom surfaces of one or more features of the patterned substrate. The bottom surface rate can range from approximately −10 nm/min to approximately +10 nm/min. For example, the bottom surface deposition rate can range from approximately −5 nm/min to approximately +5 nm/min.

During at least a portion of the NND processing time, material can be deposited onto the sidewalls of the features of the patterned substrate while depositing substantially no material in the field area of the patterned substrate. During at least a portion of the NND processing time, material can be deposited and/or removed from the bottom surfaces of the features of the patterned substrate while depositing substantially no material in the field area of the patterned substrate.

During at least a portion of the NND processing time, the substrate bias generator can be operated at approximately 13.56 MHz, and the substrate bias power can range from approximately 500 w to approximately 1500 w. For example, the substrate bias power can range from approximately 750 w to approximately 900 w. The substrate bias power can be adjusted to one or more values in a range above a sputtering threshold during the NND process. For example, a controller can be used, and the substrate bias power can be changed to optimize the process to ensure that substantially no net deposition takes place in the field region of the pattern substrate.

The target power can range from approximately 100 w to approximately 1500 w. For example, the target power can range from approximately 450 w to approximately 550 w. The ICP power can range from approximately 2000 w to approximately 10000 w. For example, the ICP power can range from approximately 3000 w to approximately 6000 w.

In addition, an NND process gas can flow into the processing chamber during at least a portion of the NND processing time. The NND process gas can comprise an inert gas, a nitrogen-containing gas, an oxygen-containing gas, or a metal-containing gas, or a combination thereof.

The nitrogen-containing gas can comprise $N_2$, NO, $N_2O$, and $NH_3$, and the oxygen-containing gas can comprise $O_2$, NO, $N_2O$, and $H_2O$.

The inert gas can comprise argon, helium, krypton, radon, or xenon, or a combination thereof. The metal-containing gas comprises copper (Cu), tantalum (Ta), titanium, (Ti), ruthenium (Ru), iridium (Ir), aluminum (Al), silver (Ag), or lead (Pt), or a combination thereof.

When the NND process is performed in a different chamber, the patterned substrate can be positioned on a second wafer table with a second processing chamber. A high density plasma can be created in the second processing chamber, and the high density plasma can comprise a large concentration of metal ions and a large number of process gas ions.

The proper processing chamber conditions can be established in the second processing chamber, and an NND process can be performed. A chamber pressure, chamber temperature, substrate temperature, a process gas chemistry, a process gas flow rate, a target material, an ICP power, substrate position, a target power, or a substrate bias power, or a combination thereof, can be adjusted to establish an NND deposition rate.

In an alternate embodiment, the deposition system may comprise a second substrate bias generator coupled to the second wafer table. The second substrate bias generator can be a second RF generator, and the second RF generator can operate in a frequency range from approximately 1 MHz to approximately 100 MHz. For example, the second RF generator can be operated at approximately 13.56 MHz. The second substrate bias power can range from approximately 500 w to approximately 1500 w. For example, the substrate bias power can range from approximately 750 w to approximately 900 w.

During at least a portion of the NND processing time, the second substrate bias power can be adjusted to one or more values in a range above a sputtering threshold. For example, a controller can be used, and the second substrate bias power can be changed to optimize the process to ensure that substantially no net deposition takes place in the field region of the patterned substrate.

The NND deposition rate can comprise a field deposition rate that is the rate of deposition of material in the field region of the patterned substrate. The field deposition rate can range from approximately −10 nm/min to approximately +10 nm/min. For example, the field deposition rate can range from approximately −5 nm/min to approximately +5 nm/min. The NND deposition rate can comprise a sidewall deposition rate that is the rate of deposition of material on one or more sidewalls of one or more features of the patterned substrate. The sidewall deposition rate can range from approximately 0 nm/min to approximately +10 nm/min. For example, the field deposition rate can range from approximately 0 nm/min to approximately +5 nm/min. The NND deposition rate can comprise a bottom surface deposition rate that is the rate of deposition of material on one or more bottom surfaces of one or more features of the patterned substrate. The bottom surface rate can range from approximately −10 nm/min to approximately +10 nm/min. For example, the bottom surface deposition rate can range from approximately −5 nm/min to approximately +5 nm/min.

In an alternate embodiment, the deposition system may comprise a second target, and a second target power source can provide a second target power to the second target. The second target power source can be a DC power source. In an alternate embodiment, the second target power source can be an RF generator that can be operated in a frequency range from approximately 1 MHz to approximately 100 MHz. The second target power can range from approximately 100 w to approximately 1500 w. For example, the second target power can range from approximately 450 w to approximately 550 w.

In addition, the deposition system may comprise a second antenna, a second dielectric window coupled to the second antenna and a wall of the second processing chamber, a second louvered deposition baffle coupled to the second dielectric window, and a second ICP source coupled to the second antenna to provide a second ICP power to the second antenna. Alternately, different configurations can be used. The second ICP power can be adjusted to establish a high density plasma in the second processing chamber during the NND process. For example, a controller can be used, and the second ICP power can be changed to optimize the process to ensure that substantially no overhang is produced.

The second ICP source can be an RF generator, and the second ICP source can operate in a frequency range from approximately 1.0 MHz to approximately 100 MHz. For example, the second ICP source can be operated at approximately 13.56 MHz. The second ICP power can range from approximately 2000 w to approximately 10000 w. For example, the second ICP power can range from approximately 3000 w to approximately 6000 w.

In another embodiment, the deposition system may comprise a second pressure control system coupled to the second processing chamber, and the second pressure control system can be used to establish an NND chamber pressure during at least a portion of the NND processing time. The NND chamber pressure can range from approximately 1 mTorr to approximately 100 mTorr, and alternately, the NND chamber pressure can range from approximately 20 mTorr to approximately 70 mTorr, In another embodiment, the deposition system may also comprise a second gas supply system coupled to the second processing chamber, the second gas supply system can be used to flow NND process gas into the second processing chamber during at least a portion of the NND processing time. The NND process gas can comprise an inert gas, a nitrogen-containing gas, an oxygen-containing gas, or a metal-containing gas, or a combination thereof.

The nitrogen-containing gas can comprise N2, NO, N2O, and NH3, and the oxygen-containing gas can comprise O2, NO, N2O, and H2O.

The inert gas can comprise argon, helium, krypton, radon, or xenon, or a combination thereof. The metal-containing gas comprises copper (Cu), tantalum (Ta), titanium (Ti), ruthenium (Ru), iridium (Ir), aluminum (Al), silver (Ag), or lead (Pt), or a combination thereof.

In various embodiments, the NND process can be used to perform one or more of the following procedures: deposit a seed layer, repair a seed layer, deposit a barrier layer, and repair a barrier layer.

In various embodiments, the second process can comprise an NND process or an LND process.

In 340, a query is performed to determine when to stop performing the second process. When a decision is made to stop the second process, procedure 300 continues to 345.

When a decision is made not to stop the second process, procedure 300 branches back to 335, and procedure 300 continues as shown in FIG. 3. For example, one or more of the second processes may be perform one or more times.

Measurement data can be obtained during the second process and used to determine when to stop the second process. Measurement data can include chamber pressure data, chamber temperature data, substrate temperature data, process gas chemistry data, process gas flow rate data, target material data, ICP power data, substrate position data, target power data, substrate bias power data, processing time data, or process recipe data, or a combination thereof.

In some cases the wafer can be removed from the processing chamber and measured in another chamber. For example, an optical digital profile (ODP) tool can be used. In addition, SEM data and/or TEM data can be used.

A processing time may be used to determine when to stop the second process. Alternately, thickness data can be used to determine when to stop the second process.

In 370, a query is performed to determine when to perform an additional process. When a decision is made to perform an additional process, procedure 300 continues in 350, and the additional process is performed in 345. When a decision is made not to perform an additional process, procedure 300 branches to 355 and ends.

The additional process can comprise an LND process, an NND process, a conventional deposition process, an etching process, a deposition/etch process, a cleaning process, a measurement process, a storing process, or an electroplating process, or a combination thereof. The additional processes can be performed in the same processing chamber or other processing chambers. For example, one or more processing chambers can be coupled to each other by a transfer system.

Measurement data can be obtained during the first and/or second process and used to determine when the procedure is finished. Measurement data can include chamber pressure data, chamber temperature data, substrate temperature data, process gas chemistry data, process gas flow rate data, target material data, ICP power data, substrate position data, target power data, substrate bias power data, processing time data, or process recipe data, or a combination thereof.

In some cases the wafer can be removed from the processing chamber and measured in another chamber. For example, an optical digital profile (ODP) tool can be used. In addition, SEM data and/or TEM data can be used.

A processing time may be used to determine when to stop the second process. Alternately, thickness data can be used to determine when to stop the second process.

Figure 4:
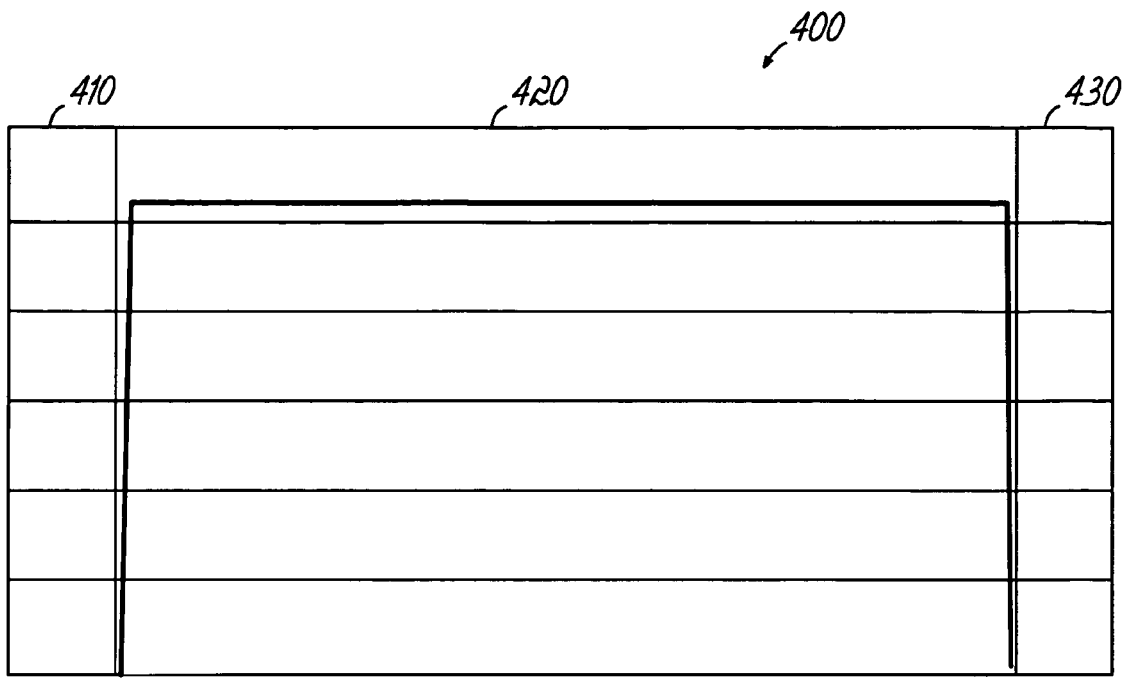
FIG. 4 illustrates an exemplary deposition process in accordance with an embodiment of the invention.

FIG. 4 illustrates an exemplary deposition process in accordance with an embodiment of the invention. In the illustrated embodiment, a simplified graph of the deposition process is shown. For example, a simplified process 400 can comprise a pre-process time period 410, a process time period 420, and a post-process time period 430.

During the pre-process time period, the processing tool can be setup. The substrate can be loaded onto the wafer table into the processing chamber and the wafer table can be set to process height. Process gas can be introduced into the processing chamber to elevate the chamber pressure. The substrate can be electrostatically chucked onto the wafer table. In addition, backside gas cooling can be initiated.

During the process time period, process gas can be introduced into the processing chamber to control the processing pressure. An ICP source can be adjusted and a relatively high ICP power can be provided to the antenna. A DC source can be adjusted; the desired LND DC power can be provided to the target during the LND process; and the desired NND DC power can be provided to the target during the NND process. In addition, an RF Bias power source can be adjusted; the desired LND RF Bias power can be provided to the target during the LND process; and the desired NND RF Bias power can be provided to the target during the NND process.

During the post-process time period, the wafer table can be set to an extraction height. The flow of process gas can be stopped, and the backside gas cooling can be stopped. The substrate can be electrostatically de-chucked from the wafer table. Chamber pressure can be stabilized; the substrate can be removed from the wafer table; and the substrate can be transfer out of the processing chamber.

Figure 5:
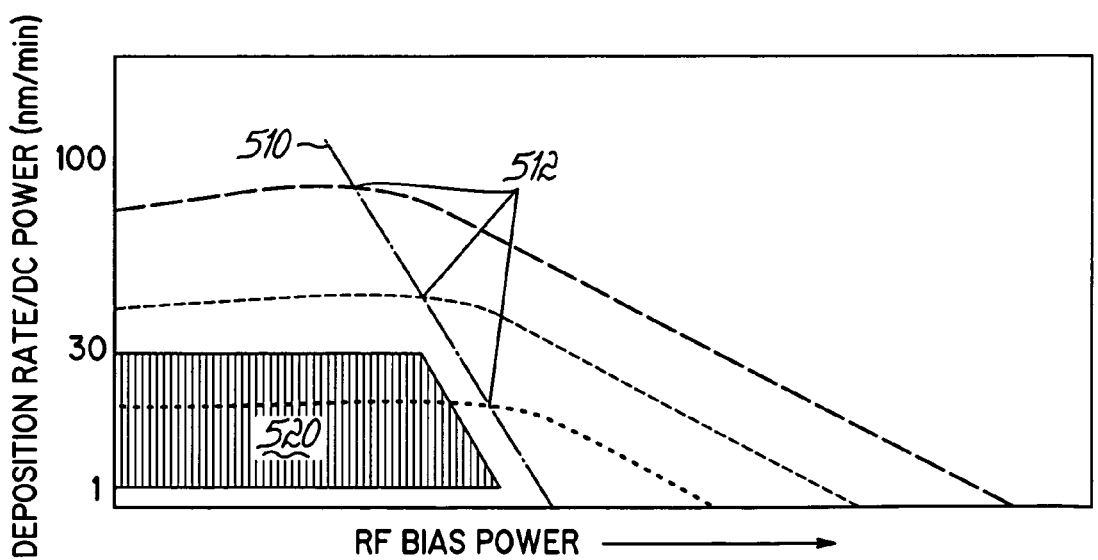
FIG. 5 illustrates an exemplary graph of an LND process space in accordance with an embodiment of the invention.

FIG. 5 illustrates an exemplary graph of an LND process space in accordance with an embodiment of the invention. As shown in the illustrated embodiment, an LND process space can be defined by using RF bias power for the x-axis and using the ratio of deposition rate to DC Power for the y-axis. In alternate embodiments, other process parameters and/or combinations of process parameters may be used to define an LND process space.

A line 510 is shown drawn through points 512 that denote the points at which etching begins to take place. An LND zone 520 is also shown in FIG. 5.

The LND zone shows an exemplary region where an LND process can be performed.

Figure 6:
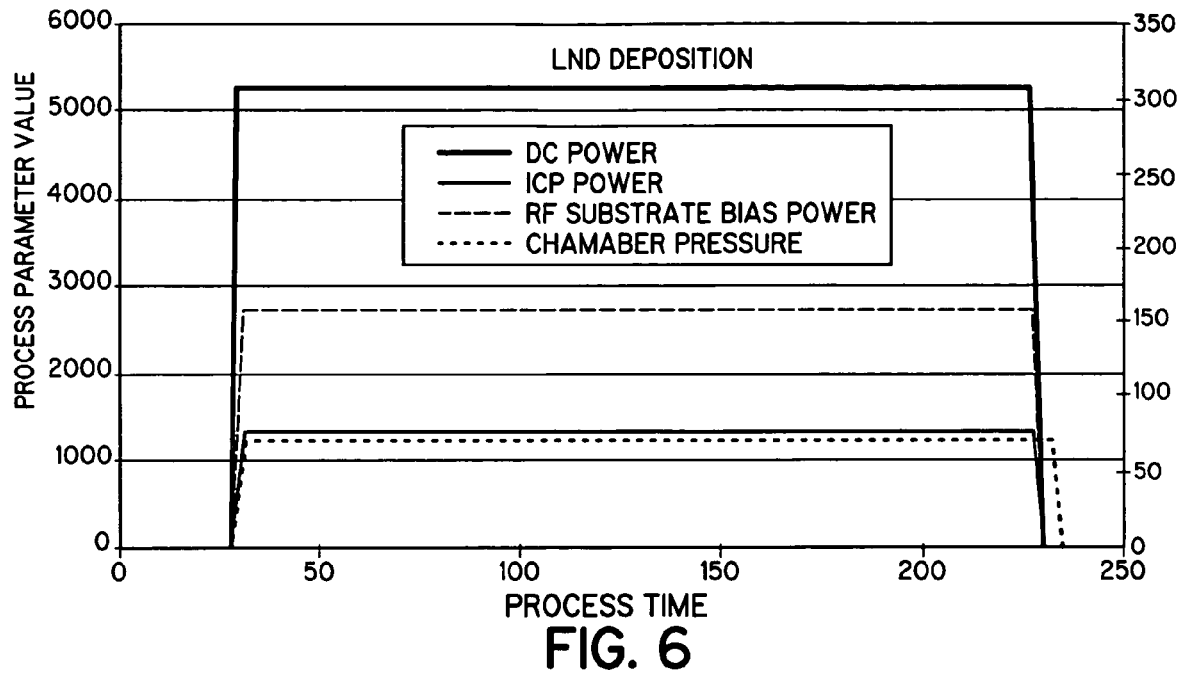
FIG. 6 illustrates an LND barrier deposition process in accordance with an embodiment of the invention.

FIG. 6 illustrates an LND process in accordance with an embodiment of the invention. In the illustrated embodiment, an LND barrier deposition process is shown, in which various process parameters are varied to achieve a substantially uniform barrier layer. As shown, DC power from the power source 24 to the target 25 can be switched on, changed to different levels, and switched off during the LND barrier deposition process. "DC Power" refers to DC power applied from the power supply or source 24 to the target 25 material to cause material to sputter. In addition, ICP power from the RF generator 27 to the antenna 26 can be switched on and switched off during the LND barrier deposition process. "ICP Power" refers to the RF inductively coupled power from generator 27 used to form dense plasma. RF substrate bias power from the RF bias generator 28 to the wafer table 22 can also be switched on and switched off during the LND barrier deposition process. "RF Substrate Bias Power" refers to the RF power applied to the table 22 from the RF bias generator 28 to create a negative bias on the substrate 21. Furthermore, chamber pressure can be changed to different values during the LND barrier deposition process.

An iPVD system can be used to perform the LND barrier deposition process. During the LND barrier deposition process, materials to be deposited can be sputtered or otherwise vaporized from a source and then a substantial fraction of the vaporized material can be converted to positive ions before reaching the wafer to be coated. A plurality of ions can be created by a high-density plasma that can be generated from process gas in a vacuum chamber. Then, electromagnetic forces can be applied to the positive ions of coating material, such as by applying a negative bias on the wafer. The bias causes ions of coating material to be accelerated toward the wafer so that an increased fraction of the coating material deposits onto the wafer at angles approximately normal to the wafer. In this manner, a thin uniform barrier layer can be deposited over the field area of the wafer surface and within the high aspect ratio features on the wafer. The LND process provides excellent coverage of the bottom and sidewalls of the high aspect ratio features.

During the LND process, a wafer 21 can be held in place on top of a temperature-controlled wafer table 22. Process gas can be supplied from a source 23 into a vacuum processing chamber 30, the pressure of which is maintained at a vacuum by pump 29 and adjusted to a proper ionized deposition range for the LND process. DC power is supplied from a power source 24 to the target 25, and power sources 24 can be turned on and adjusted to power levels appropriate for the LND process. Wafer RF bias is supplied to the chuck 22 by RF bias generator 28, which can also be turned on and adjusted to a level appropriate during the LND process. In addition, ICP power from the RF generator 27 to the antenna 26 can be switched on and adjusted during the LND process. Furthermore, chamber pressure can be changed to different values during the LND process.

Process gas can be supplied from a gas supply system 23 into the vacuum processing chamber 30, the pressure of which is maintained at a vacuum by pressure control system 29 and adjusted to a proper ionized deposition range for the LND process.

The iPVD system can comprise a controller that can be coupled to the processing chamber, and the method can further comprise measuring one or more processing parameters; adjusting at least one process parameter to a first level during at least a portion of the LND pre-process time period; adjusting the at least one process parameter to a second level during at least a portion of the LND process time period; and adjusting the at least one process parameter to a third level during at least a portion of the LND post-process time period.

In the metallization of high aspect ratio via holes and trenches on semiconductor wafers, it is required that the barrier layer and the seed layer have good sidewall and bottom coverage. The barrier layer needs to be as thin as possible without sacrificing its barrier properties. The barrier layer must be thin because its electrical resistance, which adds to the electrical resistance of the via structure, must be minimized. It needs to be conformal and continuous to prevent diffusion of seed layer material into the dielectric layer and into other layers to prevent reliability problems. This requires that the barrier layer thickness must be well controlled and minimized especially at the bottom of the via. A thick barrier layer at the bottom of the via may add substantial undesirable electrical resistance to the resistance of interconnect metallization.

As shown in FIG. 6, the chamber pressure can be less than approximately 20 mTorr during at least a portion of the LND pre-process time period; the chamber pressure can be greater than approximately 50 mtorr and less than approximately 100 mTorr during the LND process time period; and the chamber pressure can be less than approximately 20 mTorr during at least a portion of the LND post-process time period. The ICP power can be less than approximately 20 w during at least a portion of the LND pre-process time period; the ICP power can be greater than approximately 5000 w and less than approximately 5500 w during at least a portion of the LND process time period; and the ICP power can be less than approximately 20 w during at least a portion of the LND post-process time period.

In addition, the DC power can be less than approximately 10 w during at least a portion of the LND pre-process time period; the DC power can be greater than approximately 1000 w and less than approximately 1500 w during at least a portion of the LND process time period; and the DC power can be less than approximately 20 w during at least a portion of the LND post-process time period. The RF substrate bias power can be less than approximately 10 w during at least a portion of the LND pre-process time period; the RF substrate bias power can be greater than approximately 130 w and less than approximately 200 w during at least a portion of the LND process time period; and the RF substrate bias power can be less than approximately 10 w during at least a portion of the LND post-process time period.

As shown in the illustrated embodiment, the LND pre-process time period can be less than approximately 50 seconds and greater than approximately 20 seconds. For example, the LND pre-process time period can range from approximately 25 seconds to approximately 35 seconds. Alternately, different LND pre-process time periods can be used.

The LND process time period can be less than approximately 250 seconds and greater than approximately 150 seconds. For example, the LND process time period can range from approximately 180 seconds to approximately 220 seconds. In alternate embodiments, the LND process time period can range from approximately 10 seconds to approximately 1000 seconds, and the LND process time period can be determined by measuring a deposition thickness.

In addition, the LND post-process time period can be less than approximately 50 seconds and greater than approximately 20 seconds. For example, the LND post-process time period can range from approximately 25 seconds to approximately 35 seconds. Alternately, different LND post-process time periods can be used.

A single LND process time period is shown in FIG. 5, but this is not required for the invention. In alternate embodiments, a substrate can be processed using one or more LND process time periods in which the processing conditions can be different. For example, processing conditions may be established for isolated features during one LND process time period, and other processing conditions may be established for closely packed features during another LND process time period.

Also, the iPVD system further comprises a gas supply system coupled to the processing chamber, and the LND method can further comprise: providing a first process gas during at least a portion of the LND pre-process time period; providing a second process gas during at least a portion of the LND process time period; and providing a third process gas during at least a portion of the LND post-process time period. In addition, different flow rates can be established during the different LND time periods, and the flow rates can be changed during the different LND time periods.

In one embodiment, the first process gas can comprise an inert gas or a nitrogen-containing gas, or a combination thereof; the second process gas can comprise an inert gas, a nitrogen-containing gas, or a metal-containing gas, or a combination thereof; and the third process gas can comprise an inert gas or a nitrogen-containing gas, or a combination thereof. For example, the inert gas can comprise argon, helium, krypton, radon, or xenon, or a combination thereof. Also, the metal-containing gas can comprise copper (Cu), tantalum (Ta), titanium (Ti), ruthenium (Ru), iridium (Ir), aluminum (Al), silver (Ag), or lead (Pt), or a combination thereof.

In the LND barrier deposition process, metal can be sputtered off the target at a low rate. This results in only a minor dilution of the process gas ion plasma. The metal ionizes and is deposited on the wafer with a rate that can be less than 10 nm/min. A low bias is applied to the wafer to attract the ions to the bottom of the feature. Because of the low field deposition rate and the low bias, the metal deposits with little or no overhang developing. The sidewall coverage is enhanced, and the result is a highly conformal metal deposition, ideal for a barrier metal.

If the process is to be a reactive one, such as TaN, the N2 or another reactive gas can be added during the LND barrier deposition process. Typically, the nitrogen flow is such that the iPVD process is performed in a target non-poisoned mode or metal mode, which is more desirable; however, the poisoned mode can be achieved by increasing the reactive gas flow. Nitrogen flow can be further varied to grade the metal nitride composition from a nitrogen rich to nitrogen deficient metal nitride rather easily with this invention. This feature is highly desirable because it allows the user to tailor the stoichiometry of the metal nitride. Whether better barrier properties (higher N2 content) are desired, or better wetting properties (lower N2 content) are necessary, this invention can accommodate the user's needs. For example, the sidewall stoichiometry of a metal nitride can be controlled throughout the deposition process by varying nitrogen or reactive gas flow. In addition, the nitridization of a metal film sidewall can be controlled by using an Ar/N2 ion plasma subsequent to the deposition step.

The methods of this invention are particularly advantageous, when used in conjunction with an iPVD system, to deposit highly ionized material, like Ta and Cu with very low rates. The invention also has the advantage of being able to uniformly deposit the same material(s) at high pressures of 30-100 mT, which also enables the user to deposit ionized metal with relatively low deposition rates. In addition, the process of this invention can easily be adapted to different metals, especially when used in conjunction with the previously described apparatus.

The invention can use an iPVD system that is operated in a deposition mode with high metal ion fraction and large flux of process gas ions to the substrate that produces a reduced sticking coefficient and increased surface mobility of the deposited material thereby enhancing the sidewall coverage of the features of a patterned wafer.

The invention can use an iPVD system that is operated in a deposition mode with an ultra-low deposition rate in the field area of a patterned substrate, and provides for enhanced conformality, particularly sidewall coverage relative to typical iPVD processes.

In another embodiment, an iPVD process can be performed in which the bias to the wafer is raised to such a power that there is substantially no deposition of metal on the field while deposition still occurs on the sidewalls of the features. This can easily be achieved with a reduced metal flux to the surface of the substrate. No etching of the interlayer dielectric or pre-metalized surface occurs during this process as a result of balancing the deposition and etch rates of the metal by application of an appropriate wafer bias.

Figure 7:
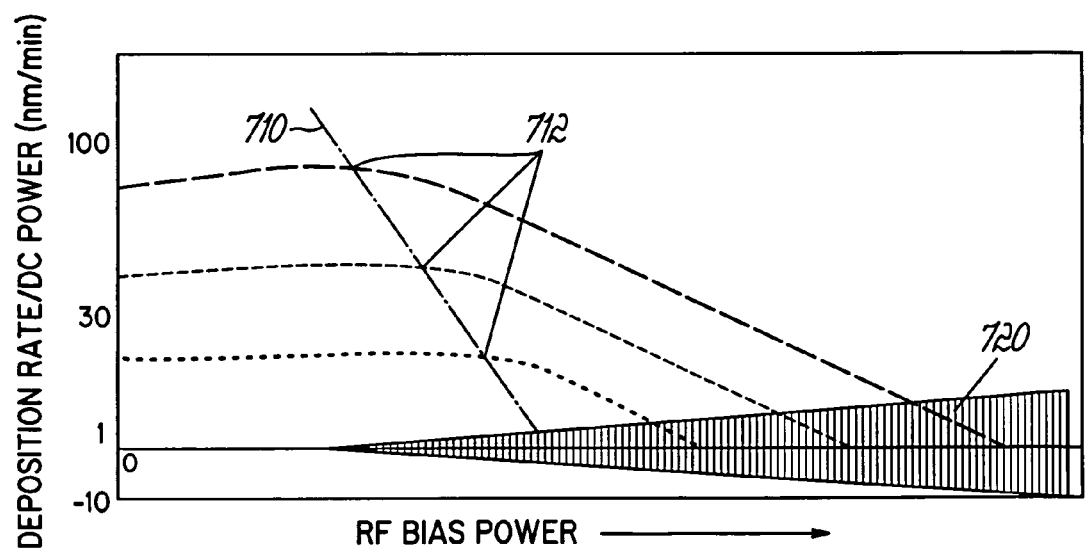
FIG. 7 illustrates an exemplary graph of an NND process space in accordance with an embodiment of the invention.

FIG. 7 illustrates an exemplary graph of an NND process space in accordance with an embodiment of the invention. As shown in the illustrated embodiment, an NND process space can be defined by using RF bias power for the x-axis and using the ratio of deposition rate to DC Power for the y-axis. In alternate embodiments, other process parameters and/or combinations of process parameters may be used to define an NND process space.

A line 710 is shown drawn through points 712 that denote the points at which etching begins to take place.

An NND zone 720 is also shown in FIG. 7. The NND zone shows an exemplary region where an NND process can be performed.

Figure 8:
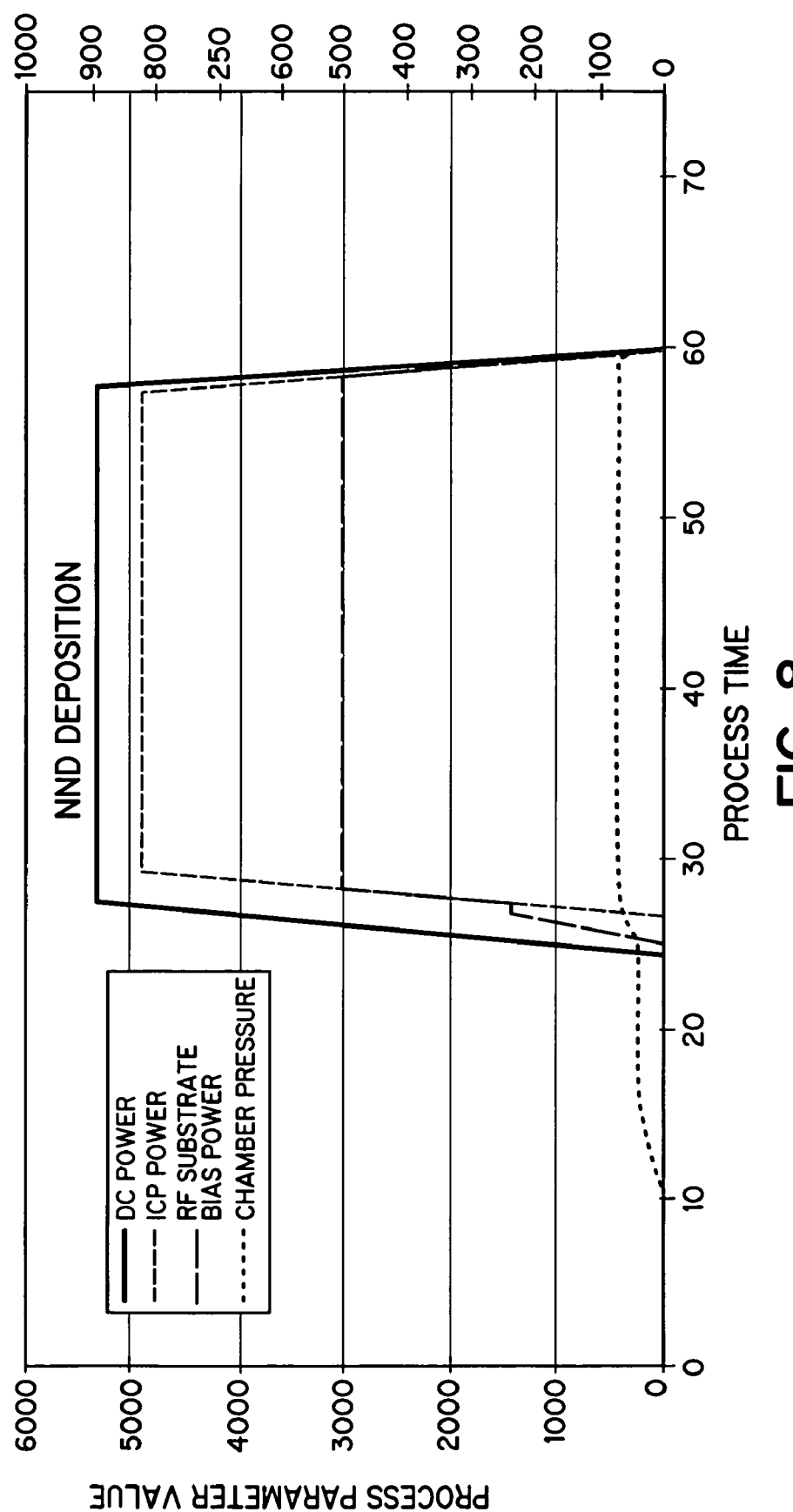
FIG. 8 illustrates an NND seed layer deposition process in accordance with an embodiment of the invention.

FIG. 8 illustrates an NND process in accordance with an embodiment of the invention. In the illustrated embodiment, an NND seed layer deposition process is shown, in which various process parameters are varied to achieve a substantially uniform seed layer. As shown, DC power from the power source 24 to the target 25 can be switched on, changed to different levels, and switched off during the NND Cu seed layer deposition process. In addition, ICP power from the RF generator 27 to the antenna 26 can be switched on and switched off during the NND Cu seed layer deposition process. RF substrate bias power from the RF bias generator 28 to the wafer table 22 can also be switched on and switched off during the NND Cu seed layer deposition process. Furthermore, chamber pressure can be changed to different values during the NND Cu seed layer deposition process.

An iPVD system can be used to perform the NND process. During the NND process, materials to be deposited can be sputtered or otherwise vaporized from a source and then a substantial fraction of the vaporized material can be converted to positive ions before reaching the wafer to be coated. A plurality of ions can be created by a high-density plasma that can be generated from process gas in a vacuum chamber. Then, electromagnetic forces can be applied to the positive ions of coating material, such as by applying a negative bias on the wafer. The bias causes ions of coating material to be accelerated toward the wafer so that an increased fraction of the coating material deposits onto the wafer at angles approximately normal to the wafer. In this manner, a minimum amount of material (substantially none) can be deposited over the field area of the wafer surface, and a small amount of material can be deposited within the high aspect ratio features on the wafer. The NND process provides excellent coverage of the sidewalls of the high aspect ratio features.

During the NND process, a wafer 21 can be held in place on top of a temperature-controlled wafer table 22. Process gas can be supplied from a source 23 into a vacuum processing chamber 30, the pressure of which is maintained at a vacuum by pump 29 and adjusted to a proper ionized deposition range for the NND process. DC power is supplied from a power source 24 to target 25, and power sources 24 can be turned on and adjusted to power levels appropriate for the NND process. Wafer RF bias is supplied to the chuck 22 by RF bias generator 28, which can also be turned on and adjusted to a level appropriate during the NND process. In addition, ICP power from the RF generator 27 to the antenna 26 can be switched on and adjusted during the NND process. Furthermore, chamber pressure can be changed to different values during the NND process.

Process gas can be supplied from a gas supply system 23 into the vacuum processing chamber 30, the pressure of which is maintained at a vacuum by pressure control system 29 and adjusted to a proper ionized deposition range for the NND process.

The iPVD system can comprise a controller that can be coupled to the processing chamber, and the method can further comprise measuring one or more processing parameters; adjusting at least one process parameter to a first level during at least a portion of the NND pre-process time period; adjusting the at least one process parameter to a second level during at least a portion of the NND process time period; and adjusting the at least one process parameter to a third level during at least a portion of the NND post-process time period.

As shown in FIG. 8, the chamber pressure can be less than approximately 20 mTorr during at least a portion of the NND pre-process time period; the chamber pressure can be greater than approximately 50 mtorr and less than approximately 100 mTorr during the NND process time period; and the chamber pressure can be less than approximately 20 mTorr during at least a portion of the NND post-process time period. The ICP power can be less than approximately 20 w during at least a portion of the NND pre-process time period; the ICP power can be greater than approximately 5000 w and less than approximately 5500 w during at least a portion of the NND process time period; and the ICP power can be less than approximately 20 w during at least a portion of the NND post-process time period.

In addition, the DC power can be less than approximately 10 w during at least a portion of the NND pre-process time period; the DC power can be greater than approximately 1000 w and less than approximately 1500 w during at least a portion of the NND process time period; and the DC power can be less than approximately 20 w during at least a portion of the NND post-process time period. The RF substrate bias power can be less than approximately 10 w during at least a portion of the NND pre-process time period; the RF substrate bias power can be greater than approximately 450 w and less than approximately 550 w during at least a portion of the NND process time period; and the RF substrate bias power can be less than approximately 10 w during at least a portion of the NND post-process time period.

As shown in the illustrated embodiment, the NND pre-process time period can be less than approximately 35 seconds and greater than approximately 10 seconds. For example, the NND pre-process time period can range from approximately 20 seconds to approximately 30 seconds. Alternately, different NND pre-process time periods can be used.

The NND process time period can be less than approximately 50 seconds and greater than approximately 15 seconds. For example, the NND process time period can range from approximately 20 seconds to approximately 40 seconds. In alternate embodiments, the NND process time period can range from approximately 10 seconds to approximately 1000 seconds, and the NND process time period can be determined by measuring a deposition thickness.

In addition, the NND post-process time period can be less than approximately 30 seconds and greater than approximately 10 seconds. For example, the NND post-process time period can range from approximately 15 seconds to approximately 25 seconds. Alternately, different NND post-process time periods can be used.

A single NND process time period is shown in FIG. 8, but this is not required for the invention. In alternate embodiments, a substrate can be processed using one or more NND process time periods in which the processing conditions can be different. For example, processing conditions may be established for isolated features during one NND process time period, and other processing conditions may be established for closely packed features during another NND process time period.

Also, the iPVD system further comprises a gas supply system coupled to the processing chamber, and the NND method can further comprise: providing a first process gas during at least a portion of the NND pre-process time period; providing a second process gas during at least a portion of the NND process time period; and providing a third process gas during at least a portion of the NND post-process time period. In addition, different flow rates can be established during the different NND time periods, and the flow rates can be changed during the different NND time periods.

In one embodiment, the first process gas can comprise an inert gas or a nitrogen-containing gas, or a combination thereof; the second process gas can comprise an inert gas, a nitrogen-containing gas, or a metal-containing gas, or a combination thereof; and the third process gas can comprise an inert gas or a nitrogen-containing gas, or a combination thereof. For example, the inert gas can comprise argon, helium, krypton, radon, or xenon, or a combination thereof. In addition, the metal-containing gas can comprise copper (Cu), tantalum (Ta), titanium, (Ti), ruthenium (Ru), iridium (Ir), aluminum (Al), silver (Ag), or lead (Pt), or a combination thereof.

In the NND barrier deposition process, metal can be sputtered off the target at a low rate. This results in only a minor dilution of the process gas ion plasma. The metal ionizes and deposits on the wafer with a rate that can be less than 0.1 nm/min. A very low bias is applied to the wafer to attract the ions to the bottom of the feature. Because there is substantially no deposition in the field and substantially uniform deposition on the sidewalls, the metal deposits with little or no overhang developing. The sidewall coverage is enhanced, and the result is a highly conformal metal deposition, ideal for a barrier metal.

In one embodiment, the NND process gas can comprise Argon gas as the sputtering gas. To deposit a barrier layer of a metal nitride such as TaNx, nitrogen gas can also be used during the NND process.

If the process is to be a reactive one, such as TaN, the N2 or another reactive gas can be added during the NND process. Typically, the nitrogen flow is such that the iPVD process is performed in a target non-poisoned mode or metal mode, which is more desirable; however, the poisoned mode can be achieved by increasing the reactive gas flow. Nitrogen flow can be further varied to grade the metal nitride composition from a nitrogen rich to nitrogen deficient metal nitride rather easily with this invention. This feature is highly desirable because it allows the user to tailor the stoichiometry of the metal nitride. Whether better barrier properties (higher N2 content) are desired, or better wetting properties (lower N2 content) are necessary, this invention can accommodate the user's needs. For example, the sidewall stoichiometry of a metal nitride can be controlled throughout the deposition process by varying nitrogen or reactive gas flow. In addition, the nitridization of a metal film sidewall can be controlled by using Ar/N2 ion plasma subsequent to the deposition step.

Lowering the pressure during the deposition processes causes the flux of positive argon ions onto the wafer to become more uniform and with the help of wafer bias, more directional and perpendicular to the substrate.

Figure 9:
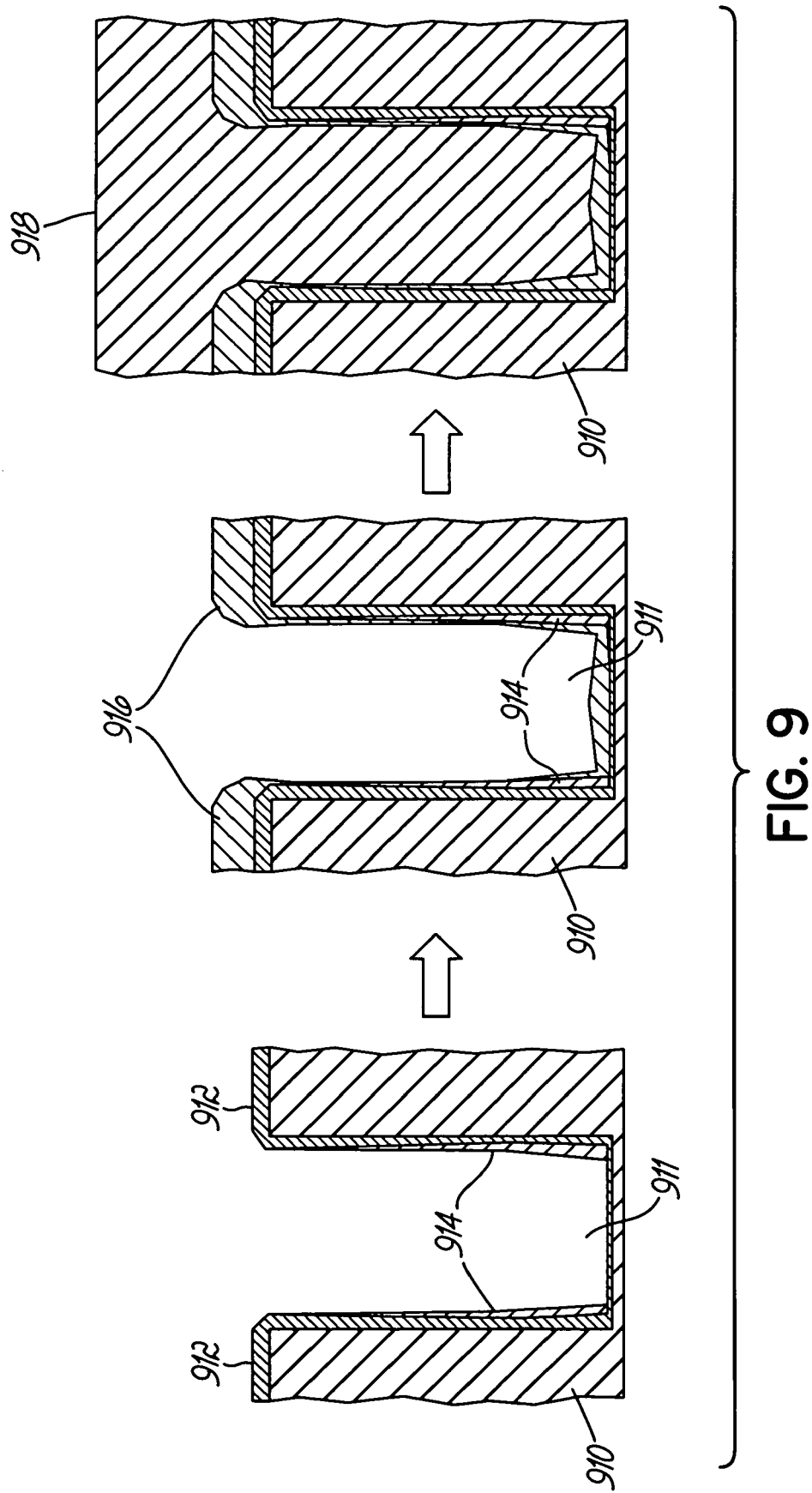
FIG. 9 illustrates a schematic representation of an exemplary process in accordance with an embodiment of the invention.

FIG. 9 illustrates a schematic representation of an exemplary process in accordance with an embodiment of the invention. A single feature 911 is shown in a substrate 910 for illustration purposes only. Substrate 910 can comprise a plurality of features having different shapes. A barrier layer 912 is shown within the feature 911 and on the top surface of the substrate 910. In one embodiment, the barrier layer 912 can comprise Ta. Alternately, other materials can be used. In addition, barrier layer 912 can be deposited having substantially no overhang using at least one of an NND process and LND process.

A seed layer 914 can be deposited within the feature 911 while producing substantially no overhang at the opening of the feature. In one embodiment, the seed layer 914 can comprise Cu. Alternately, other materials can be used. Subsequently, an additional seed layer 916 can be deposited within the feature 911 and on the top surface of the substrate 910. The additional seed layer 916 can be deposited while producing substantially no overhang at the opening of the feature. Finally, a plating layer 918 can be deposited.

Figure 10:
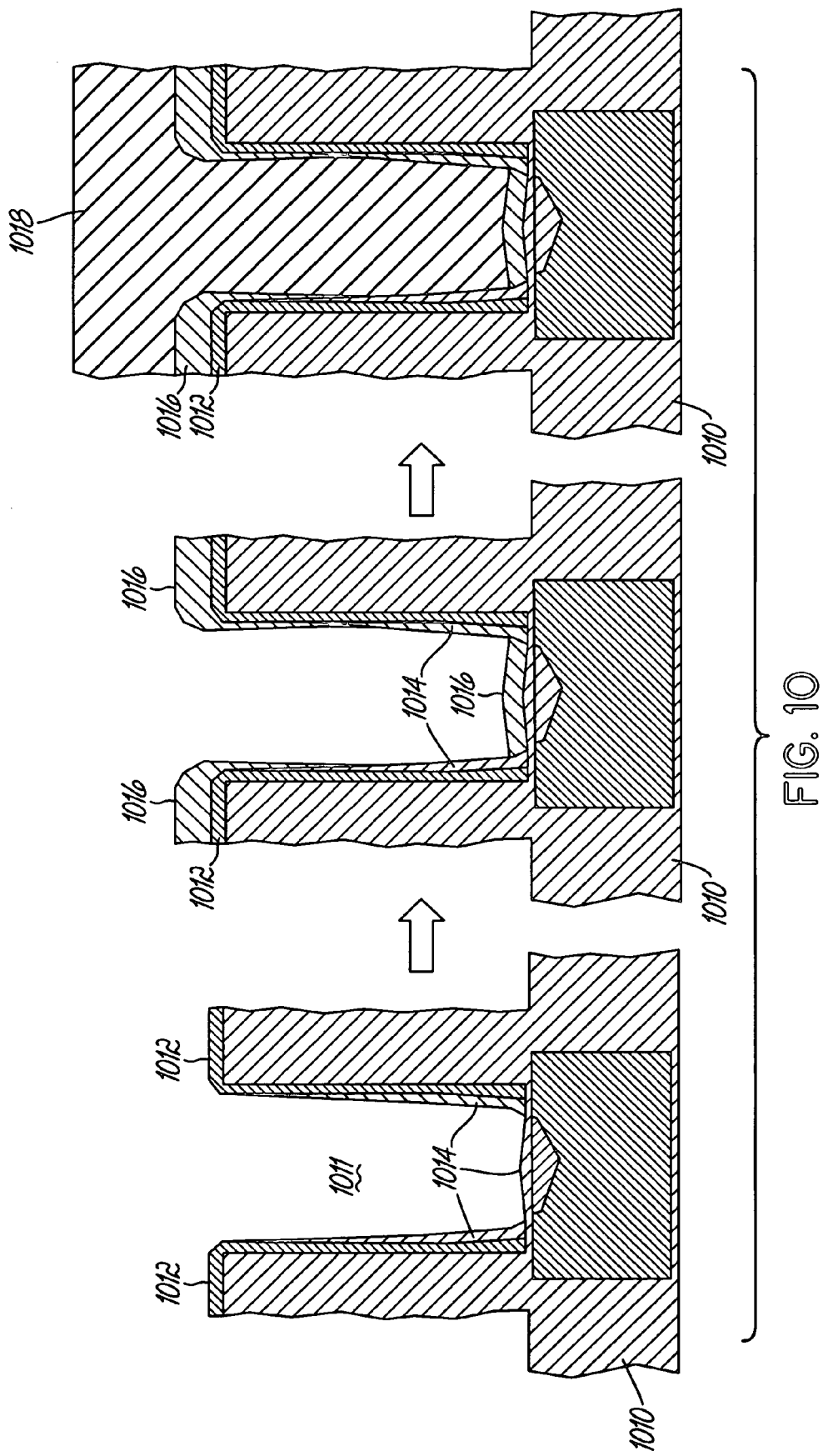
FIG. 10 illustrates a schematic representation of another exemplary process in accordance with an embodiment of the invention.

FIG. 10 illustrates a schematic representation of another exemplary process in accordance with an embodiment of the invention. A single feature 1011 is shown in a substrate 1010 for illustration purposes only. A punch through region is shown at the bottom of the feature. The NND process can provide a controlled amount of punch through. Substrate 1010 can comprise a plurality of features having different shapes. A barrier layer 1012 is shown within the feature 1011 and on the top surface of the substrate 1010. In one embodiment, the barrier layer 1012 can comprise Ta. Alternately, other materials can be used. In addition, barrier layer 1012 can be deposited having substantially no overhang using an NND process or LND process, or a combination thereof.

A seed layer 1014 can be deposited within the feature 1011 while producing substantially no overhang at the opening of the feature. In one embodiment, the seed layer 1014 can comprise Cu. Alternately, other materials can be used. Subsequently, an additional seed layer 1016 can be deposited within the feature 1011 and on the top surface of the substrate 1010. The additional seed layer 1016 can be deposited while producing substantially no overhang at the opening of the feature. Finally, a plating layer 1018 can be deposited.

Figure 11:
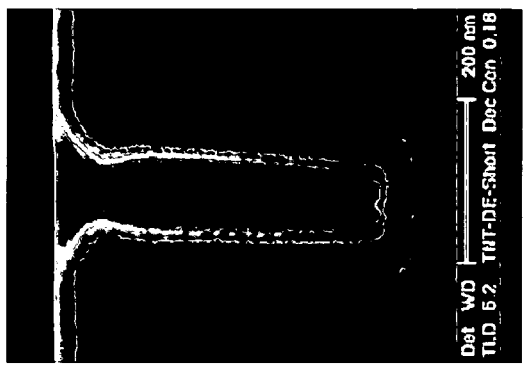
FIG. 11 illustrates an exemplary graph of an LND process space in accordance with an embodiment of the invention.
Figure 11:
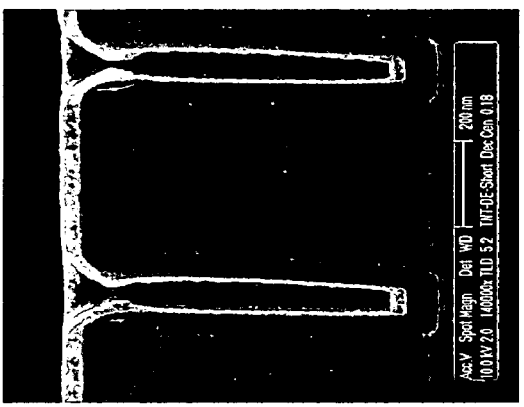
Figure 11:
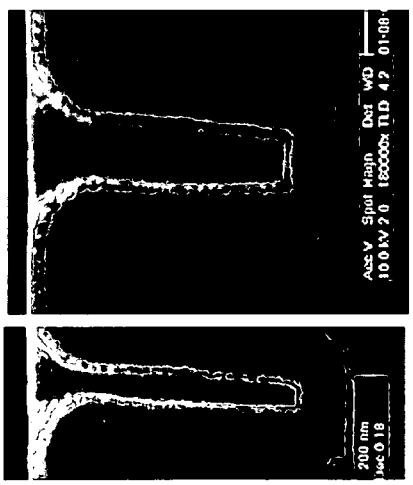

FIG. 11 illustrates exemplary results for a barrier deposition process in accordance with an embodiment of the invention. SEM results are shown for a Ta—TaN barrier process. The results show no overhang for the LND process.

Figure 12:
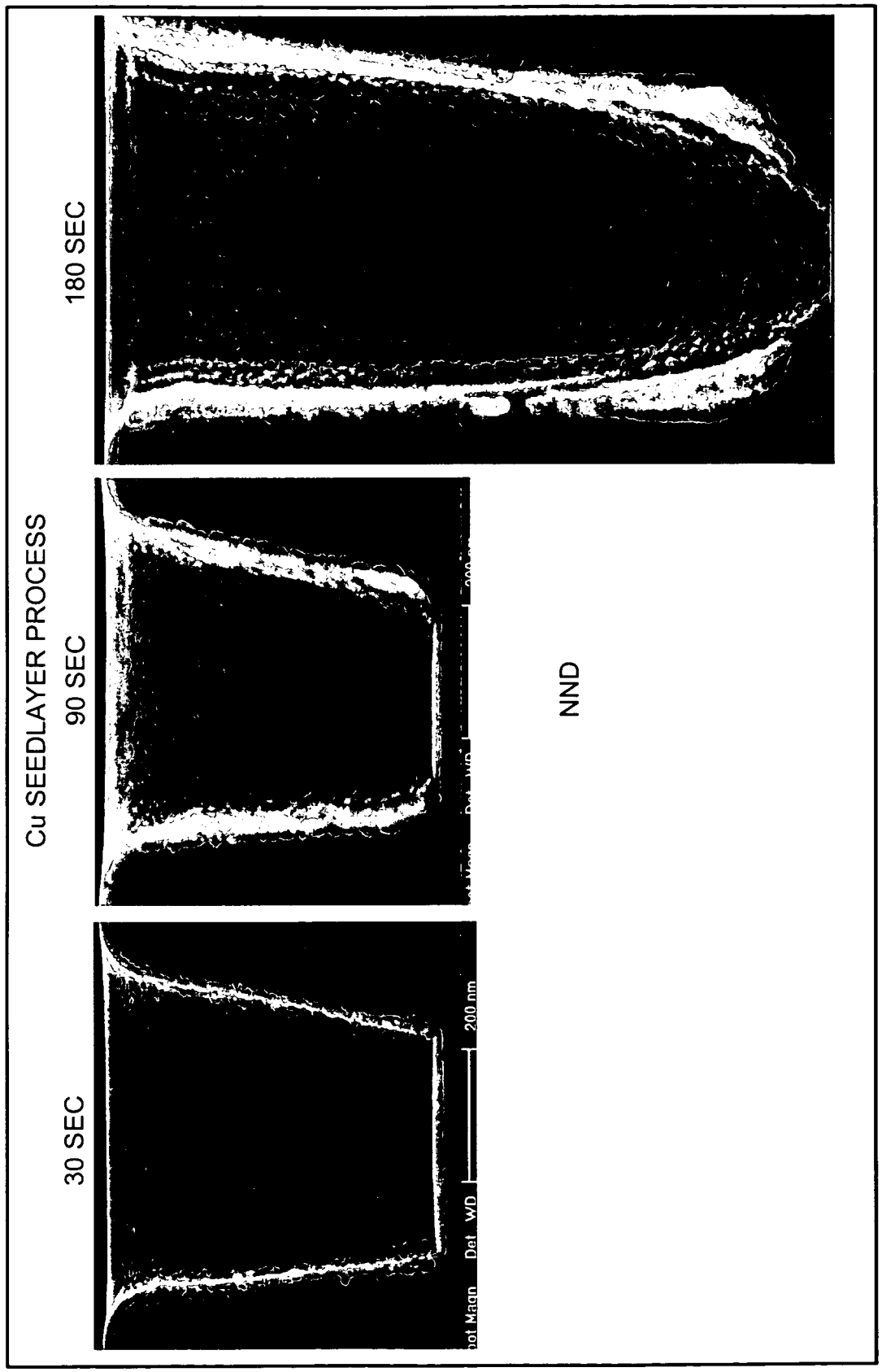
FIG. 12 illustrates exemplary results for a seed layer deposition process in accordance with an embodiment of the invention.

FIG. 12 illustrates exemplary results for a seed layer deposition process in accordance with an embodiment of the invention. SEM results are shown for a Cu seed layer process. The results show no overhang for the NND process.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of operating an ionized physical vapor deposition system comprising:

positioning a substrate on a cooled wafer table in a processing chamber, the substrate having a dielectric layer thereon, the dielectric layer having a field area and a plurality of features formed therein and each of the plurality of features including a sidewall, a bottom surface, and an opening;

creating a high-density plasma in the processing chamber, wherein the high-density plasma comprises metal ions in a Low Net Deposition (LND) process gas and a large number of inert gas ions;

exposing the substrate to the high-density plasma;

performing an LND process step wherein the LND process gas, a target power, or a substrate bias power, or a combination thereof, is adjusted to establish an LND deposition rate;

the performing of the LND process step including depositing a barrier layer onto the field area at a deposition rate of greater than zero and not more than 30 nanometers per minute (nm/min) while depositing or etching the deposited barrier layer, or a combination thereof, on the sidewall or the bottom surface, or a combination thereof, by simultaneously directing the metal ions of the LND process gas and the inert gas ions onto the substrate and thereby depositing the barrier layer onto the field area of the dielectric layer while etching the deposited barrier layer from the field area and thereby producing substantially no overhanging material at the feature openings;

changing the process from an LND process step to a No Net Deposition (NND) process step, thereby changing the deposition rate from an LND deposition rate to an NND deposition rate; and processing the patterned substrate using an NND process gas during the NND process step by depositing the barrier layer on the sidewall while depositing or etching the barrier layer, or a combination thereof, on the field area or the bottom surface, or a combination thereof at a rate ranging from about −10 nm/min to about 10 nm/min, and wherein a chamber pressure, chamber temperature, substrate temperature, an NND process gas chemistry, an NND process gas flow rate, an ICP power, a substrate position, a target power, or a substrate bias power, or a combination thereof, is adjusted to change the process from the LND process to the NND process;

wherein the NND process step is used to deposit the barrier layer onto the barrier layer deposited by the LND process step.

2. A method of processing a semiconductor substrate by depositing material into a plurality of features formed in a dielectric layer on the substrate, the dielectric layer having a field area and each of the plurality of features having a sidewall, a bottom surface, and an opening, wherein the plurality of features of the dielectric layer have a ruthenium barrier layer deposited thereon, and wherein substantially no overhanging material is produced at the opening of each of the plurality of features, the method comprising:

positioning the substrate on a wafer table within a processing chamber of an ionized physical vapor deposition (iPVD) system, wherein the wafer table is cooled;

creating, in the processing chamber, a high-density plasma of process gas ions that includes vaporized metal coating material having a high fraction of positive ions;

exposing the substrate to the high-density plasma that includes the vaporized metal coating material and gas ions and performing therewith on the substrate an iPVD process while controlling parameters of the iPVD system to simultaneously coat and etch the ruthenium barrier layer so as to thereby establish a net deposition rate ranging from about −10 nm/min to about 10 nm/min onto the field area while the vaporized metal coating material is deposited and etched on the sidewall or bottom surface, or a combination thereof;

the performing of the iPVD process includes the depositing of a seed layer onto the ruthenium barrier layer of the features of the dielectric layer.

3. The method according to claim 1, wherein the ionized physical vapor deposition system further includes a target positioned within the processing chamber and coupled to a wall thereof, a permanent magnet pack coupled to the target, and a DC power source coupled to the target.

4. The method according to claim 3, wherein the target is at least partially constructed from ruthenium.

5. The method according to claim 1, wherein the ionized physical vapor deposition system further includes an antenna positioned outside the processing chamber, a dielectric window coupled to a wall of the processing chamber near the antenna, a louvered deposition baffle coupled to the dielectric window, and an inductively coupled plasma source coupled to the antenna.

6. The method according to claim 1, wherein the ionized physical vapor deposition system further includes a gas supply system coupled to the processing chamber, wherein the gas supply system is configured to supply an inert gas comprised of at least one of argon (Ar), helium (He), krypton (Kr), radon (Rn), or xenon (Xe) to the processing chamber.

7. The method of operating a deposition system as claimed in claim 6, wherein the method further comprises:

flowing a first process gas into the processing chamber during at least a portion of the LND processing time, wherein the first process gas comprises an inert gas, a nitrogen-containing gas, an oxygen-containing gas, or a metal-containing gas, or a combination thereof.

8. The method of operating a deposition system as claimed in claim 1, wherein the metal-containing gas comprises tungsten (W), copper (Cu), tantalum (Ta), titanium (Ti), ruthenium (Ru), iridium (Ir), aluminum (Al), silver (Ag), or lead (Pt), or a combination thereof.

9. The method of processing semiconductor substrates according to claim 2, wherein the seed layer comprises copper (Cu) or ruthenium (Ru).

10. The method of processing semiconductor substrates according to claim 2, wherein the iPVD system further includes an antenna positioned outside the processing chamber, a dielectric window coupled to a wall of the processing chamber near the antenna, a louvered deposition baffle coupled to the dielectric window, and an inductively coupled plasma source coupled to the antenna.

11. The method of processing semiconductor substrates according to claim 2, wherein the iPVD system further includes a target positioned within the processing chamber and coupled to a wall thereof, a permanent magnet pack coupled to the target, and a DC power source coupled to the target.

12. The method of processing semiconductor substrates according to claim 2, wherein the iPVD system further includes a gas supply system coupled to the processing chamber, wherein the gas supply system is configured to supply an inert gas comprised of at least one of argon (Ar), helium (He), krypton (Kr), radon (Rn), or xenon (Xe) to the processing chamber.

* * * * *